United States Patent
Shim

(10) Patent No.: US 6,806,545 B2
(45) Date of Patent: Oct. 19, 2004

(54) MEMS DEVICE HAVING FLEXURES WITH NON-LINEAR RESTORING FORCE

(75) Inventor: Dong-ha Shim, Seoul (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 0 days.

(21) Appl. No.: 10/075,224

(22) Filed: Feb. 15, 2002

(65) Prior Publication Data

US 2002/0149071 A1 Oct. 17, 2002

(30) Foreign Application Priority Data

Feb. 27, 2001 (KR) .......................................... 2001-9955

(51) Int. Cl.[7] .......................... H01L 29/84; H01L 21/00
(52) U.S. Cl. ...................... 257/420; 257/415; 257/417; 257/419; 438/50; 438/53
(58) Field of Search ................................ 342/372, 368; 361/281, 283.4; 333/105, 262, 205, 235, 246; 257/415, 419, 417; 438/50, 53

(56) References Cited

U.S. PATENT DOCUMENTS 6,307,452 B1 * 10/2001 Sun ............................. 333/262
6,486,425 B2 * 11/2002 Seki ............................. 200/181

2002/0145493 A1 * 10/2002 Wang ........................... 335/78

FOREIGN PATENT DOCUMENTS

JP 2000-164104 * 6/2000

* cited by examiner

Primary Examiner—Nathan J. Flynn
Assistant Examiner—Victor A. Mandala, Jr.
(74) Attorney, Agent, or Firm—Burns, Doane, Swecker & Mathis, L.L.P.

(57) ABSTRACT

A MEMS device having flexure elements with non-linear restoring force. The MEMS device has a substrate, support elements formed on the substrate, a moveable element positioned over the substrate by the support elements to move relative substrate, flexure elements for elastically suspending the moveable element on the support elements, a driving element for moving the moveable element, and repulsive elements for increasing the repulsive force of the flexure elements when the flexure elements supporting the moveable element are resiliently deformed during movement of the moveable element. In a MEMS device, the range of controlling the position of a moveable element is extended if flexure elements having non-linear repulsive force control the position of the moveable element. A restoring force is obtained by flexure elements having non-linear repulsive force and the moveable element is prevented from sticking. The MEMS device has much higher reliability than a general MEMS device.

18 Claims, 9 Drawing Sheets

MEMS DEVICE HAVING FLEXURES WITH NON-LINEAR RESTORING FORCE

Priority is claimed to patent application number 2001-9955 filed in the Republic of Korea on Feb. 27, 2001, herein incorporated by reference.

BACKGROUND OF THE INVENTION

1. Field of the Invention

The present invention relates to a microelectromechanical system (MEMS) device having flexures with non-linear restoring force.

2. Description of the Related Art

In general, a MEMS device is obtained by processing a substrate and has a micro actuating element for moving on the substrate and a driving element for moving the micro moveable element on the substrate. The driving element has two electrodes opposite to each other to generate attractive force mainly by static electricity. In general, there are three types of actuating elements: one moves in a direction parallel to the substrate, another moves in a direction perpendicular to the substrate, and the other rotates with respect to the substrate within a predetermined range of angles.

For these movements, a moving electrode is prepared at a portion of the moveable element and a fixed electrode is prepared in a fixed position opposite to the driving electrode. In general, since in a MEMS structure, the distance between both electrodes is kept in the range of a few microns, very precise processing is required. An important defect sometimes occurring in MEMS devices is stiction of the moveable element to an adjacent fixed element.

FIG. 1 is a perspective view of a conventional micro switching device having a MEMS structure, as an example of a MEMS device which is very sensitive to the above defect. As shown in FIG. 1, an actuating stage 2 is placed over a substrate 1. The actuating stage 2 is supported by flexures 3 extending from four corners of the stage 2, and anchors 4 supporting the flexures 3.

The actuating stage 2 includes moving electrodes 2a and 2b at opposite sides and a contact point 2c between the moving electrodes 2a and 2b. Fixed electrodes 5a and 5b are placed underneath the moving electrodes 2a and 2b. Signal lines 6a and 6b for switching are positioned underneath the contact point 2c. Here, inward ends of the signal lines 6a and 6b are spaced apart from each other underneath the contact point 2c.

In the switching device, the actuating stage 2 moves in a Z direction perpendicular to the substrate 1 by static electricity between the fixed electrodes 5a and 5b and the moving electrodes 2a and 2b. Here, when the actuating stage 2 moves toward the substrate 1, the contact point 2c contacts both signal lines 6a and 6b to allow an electrical connection between the signal lines 6a and 6b.

FIG. 2 is a plan view of the actuating stage 2, the flexures 3 extending from the four corners of the actuating stage 2, and the anchors 4 supporting the flexures 3 in the conventional switching device. The actuating stage 2 and the flexures 3 are formed of metal as one body.

The conventional switching device has a disadvantage in that the actuating stage 2 easily sticks to the surface of the substrate 1 when the actuating stage 2 moves by electrostatic force between electrodes. This sticking mainly occurs if there is moisture or foreign matter between the actuating stage 2 and the substrate 1. Sticking of the actuating stage 2 may occur in use or during a manufacturing process.

Conventionally, a protrusion is prepared or a non-stick thin film is formed at the bottom surface of the actuating stage 2 in order to prevent such sticking. However, in the case of a micro switching device, switching occurs at the bottom surface of the actuating stage 2. Thus, a protrusion may increase contact resistance. Moreover, in the micro switching device having parallel electrodes, non-linear electrostatic force occurs between both electrodes. If the initial distance between the electrodes is reduced to a third, then the electrostatic force considerably increases compared to the restoring force of the flexures. As a result, when electrodes get to close, they stick together.

SUMMARY OF THE INVENTION

To solve the above-described problems, it is an object of the present invention to provide a MEMS device having flexure elements with non-linear restoring force which is capable of effectively preventing a moveable element from sticking and stably restoring the position of the moveable element.

Accordingly, to achieve the above object, there is provided a MEMS device having flexure elements with non-linear restoring force. The MEMS device includes a substrate, support elements formed on the substrate, a moveable element positioned over the substrate by the support elements to move relative substrate, flexure elements for elastically suspending the moveable element on the support elements, a driving element for causing the moveable element to move relative to the substrate, and repulsive elements for causing a sudden steep increase in the repulsive force of the flexure elements when the flexure elements supporting the moveable element are resiliently deformed by a predetermined amount during movement of the moveable element.

According to the present invention, the repulsive elements having a predetermined size are stoppers positioned between the flexure elements and static elements fixed on the substrate opposite to the flexure elements.

The stoppers may be positioned at portions of the static elements opposite to the flexure elements so that middle portions of the flexure elements contact the stoppers when the flexure elements are resiliently deformed by a predetermined amount. Also, the stoppers may be formed on middle portions of the flexure elements opposite to the static elements so that the stoppers contact the static elements when the flexure elements are resiliently deformed by a predetermined amount.

Preferably, the moveable element moves in a direction perpendicular to the plane of the substrate. The static elements may be portions of the surface of the substrate opposite to the flexure elements.

BRIEF DESCRIPTION OF THE DRAWINGS

The above object and advantages of the present invention will become more apparent by describing in detail preferred embodiments thereof with reference to the attached drawings in which.

DETAILED DESCRIPTION OF THE INVENTION

Hereinafter, preferred embodiments of a micro switching device according to the present invention will be described with reference to the attached drawings.

Figure 3:
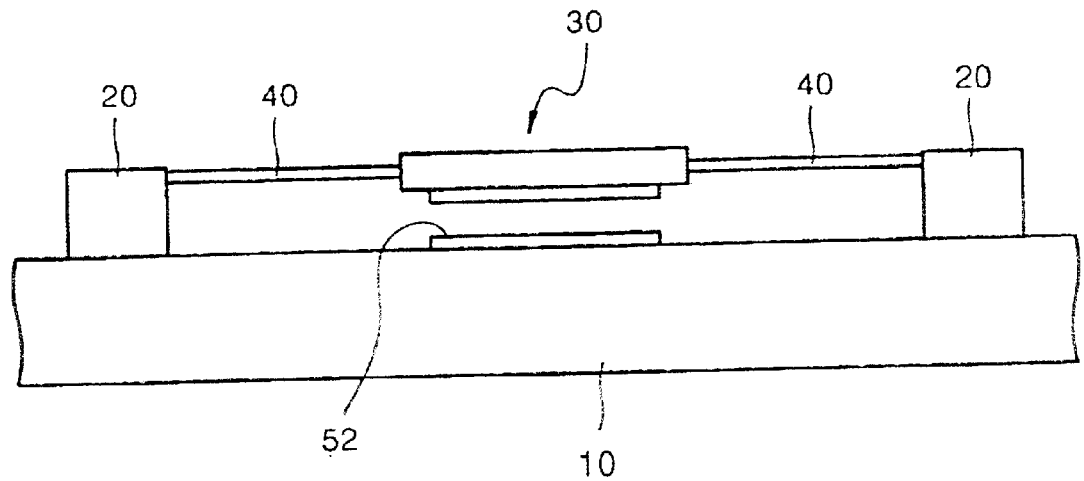
FIG. 3 is a drawing of a simple model of a conventional MEMS device.
Figure 4:
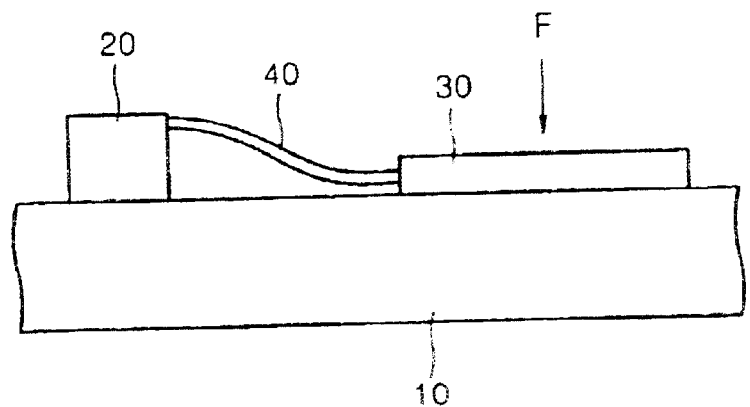
FIG. 4 is a drawing of a portion of the conventional MEMS device shown in FIG. 3, in a stuck state.

FIG. 3 is a drawing of a simple model of a conventional MEMS device. FIG. 4 is a drawing of a portion of the conventional MEMS device shown in FIG. 3, in a stuck state.

Referring to FIG. 3, in the simple model of a conventional MEMS device, supports 20 are spaced apart from each other on a substrate 10. A moveable element 30, for example, as a moving electrode, is suspended on both supports 20 by flexure elements 40 at both sides of the moveable element 30. A lower electrode 52 as a driving element is prepared on the substrate 10 directly beneath the moveable element 30.

Figure 1:
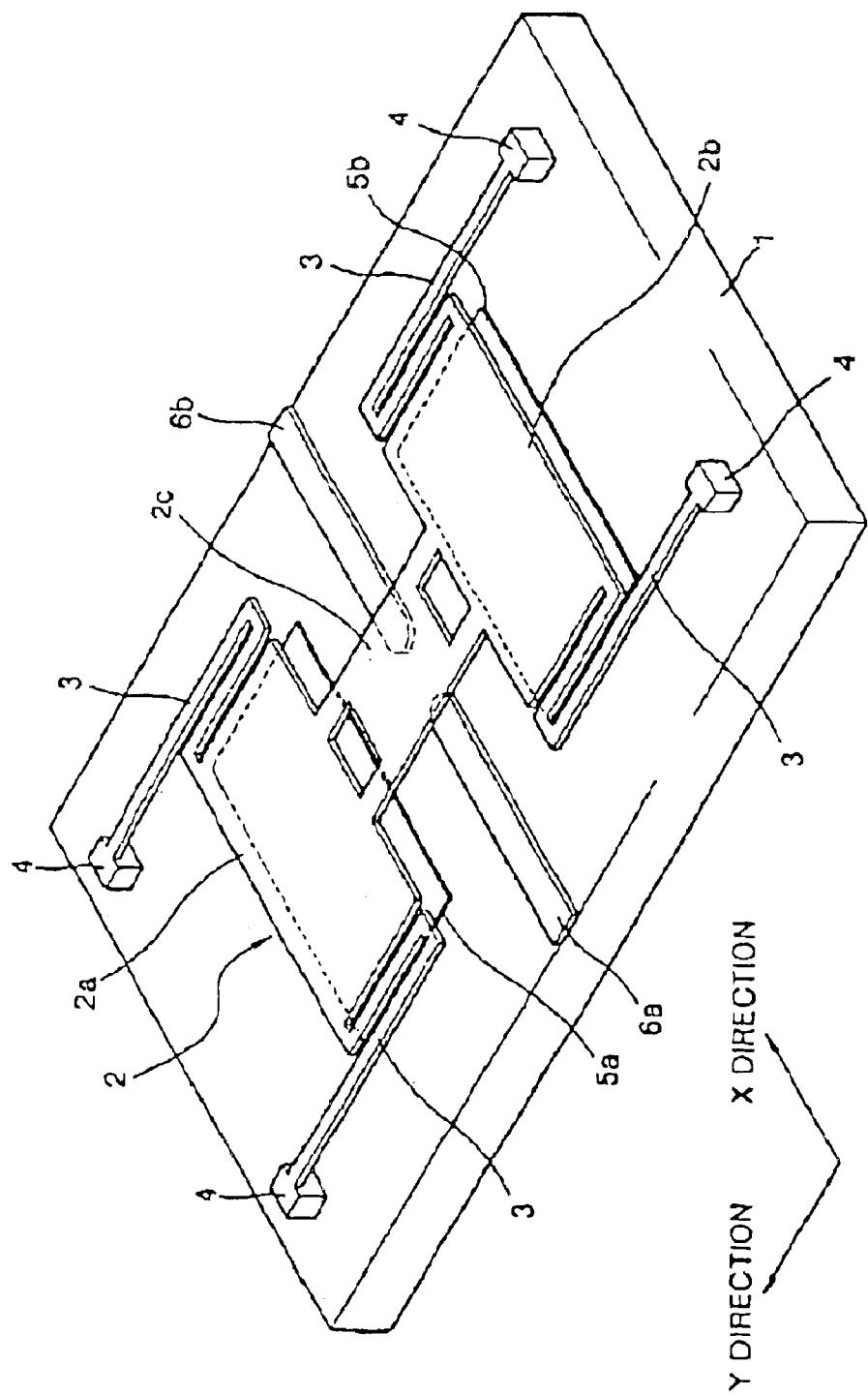
FIG. 1 is a perspective view of a micro switching device with flexures having a conventional structure.
Figure 2:
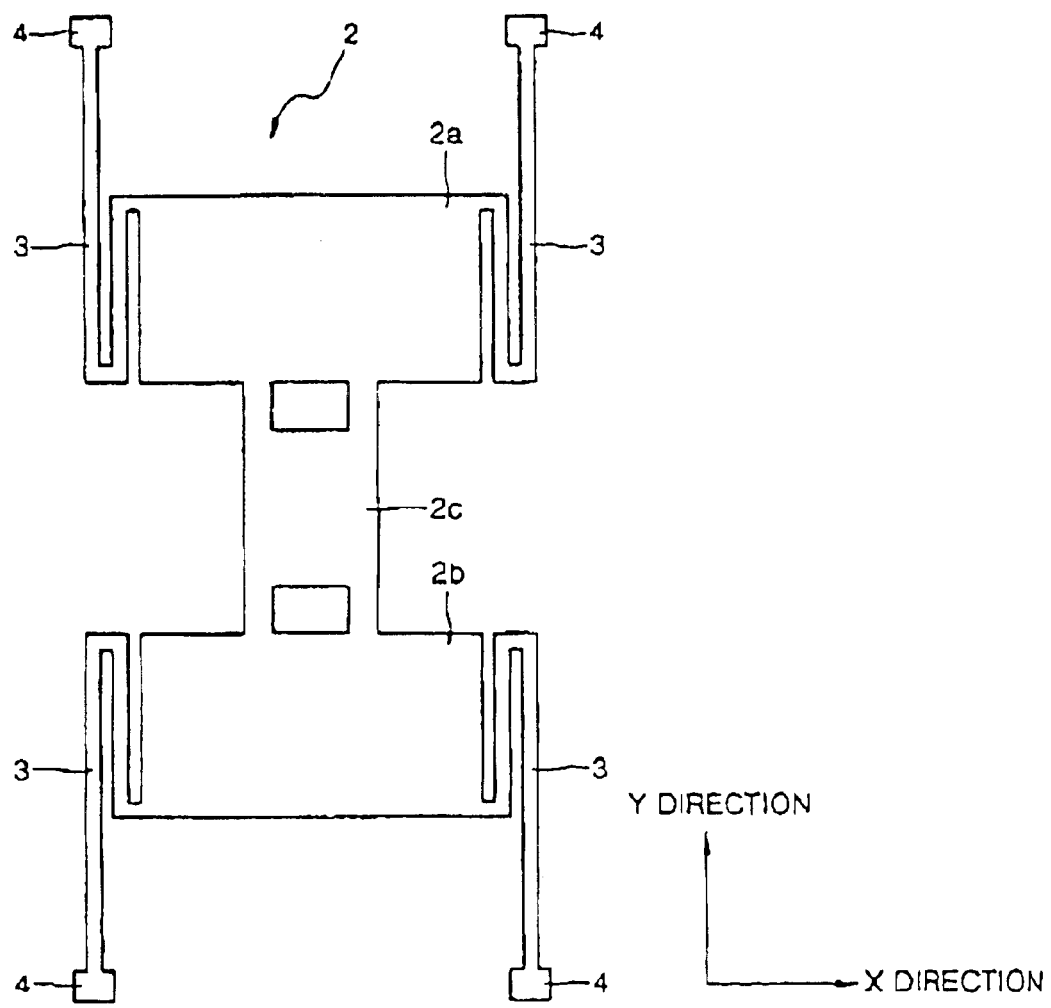
FIG. 2 is a plan view of an actuating stage and flexures of the micro switching device shown in FIG. 1.

Comparing the conventional micro switching device of FIGS. 1 and 2 with the simple model of the MEMS device shown in FIG. 3, the moveable element 30 corresponds to the actuating stage 2 or a moving electrode 2a, the supports 20 corresponds to the anchors 4, the flexure elements 40 corresponds to the "Z"-shaped flexures 3, and the lower electrode 52 corresponds to fixed electrodes 5a and 5b.

The moveable element 30 sticks closely to the surface of the substrate 10 and the flexure element 40 supporting the moveable element 30 is transformed as shown in FIG. 4 if a predetermined voltage (in general, 3V) is applied between the moveable element 30 and the lower electrode 52 in the MEMS device shown in FIG. 3. Here, the moveable element 30 is formed of a very rigid material and thus is not deformed.

Here, the moveable element 30 subject to a force (electrostatic attractive force) inversely proportional to the square of the distance closely sticks to the substrate 10 at a predetermined voltage between upper and lower electrodes.

Figure 5:
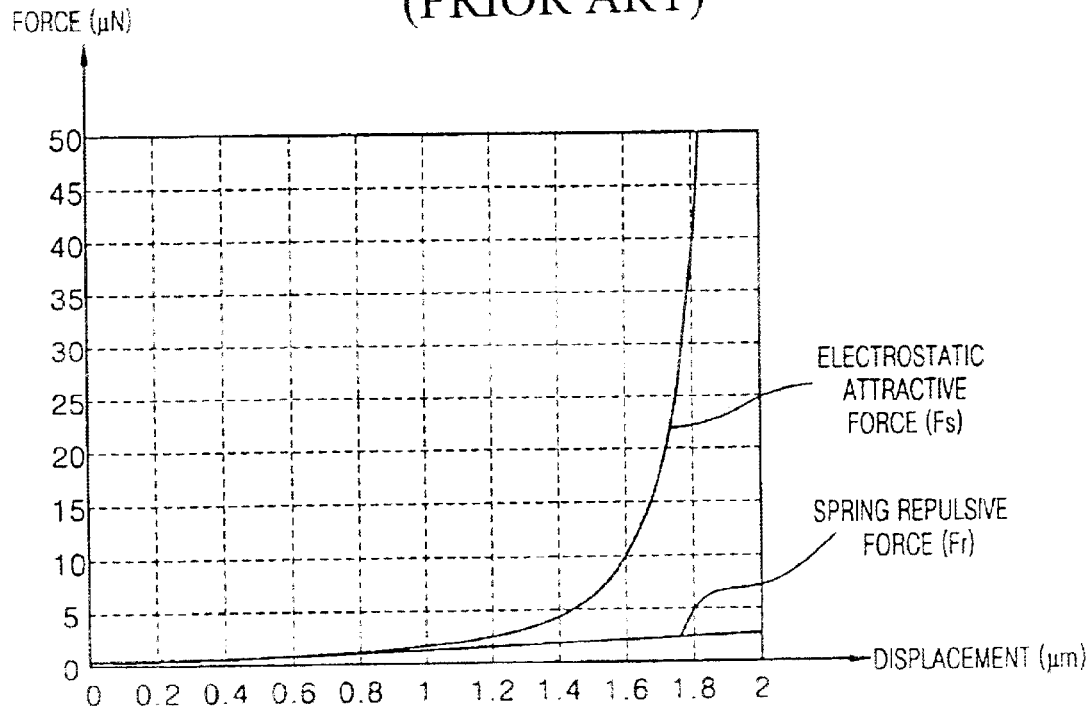
FIG. 5 is a graph showing electrostatic attractive force $F_s$ and flexure repulsive force $F_r$ versus displacement of a moveable element in a MEMS device having flexures with a conventional structure.

FIG. 5 is a graph showing electrostatic attractive force $F_s$ and flexure repulsive force $F_r$ versus displacement of the moveable element 30. As shown in FIG. 5, the electrostatic attractive force $F_s$ sharply and non-linearly increases with the increase of displacement while the flexure repulsive force $F_r$ gently and linearly increases.

Referring to FIG. 5, the electrostatic attractive force $F_s$ between the moveable element 30 and the substrate 10 is several tens of times greater than the flexure repulsive force $F_r$ when the moveable element 30 closely sticks to the substrate 10.

Figure 6:
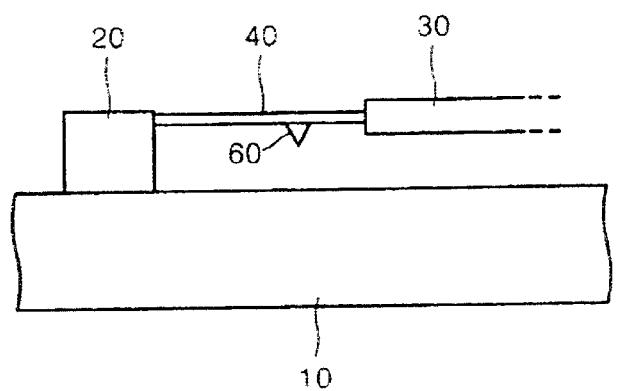
FIG. 6 is a drawing of a portion of a model of a MEMS according to the present invention.
Figure 7:
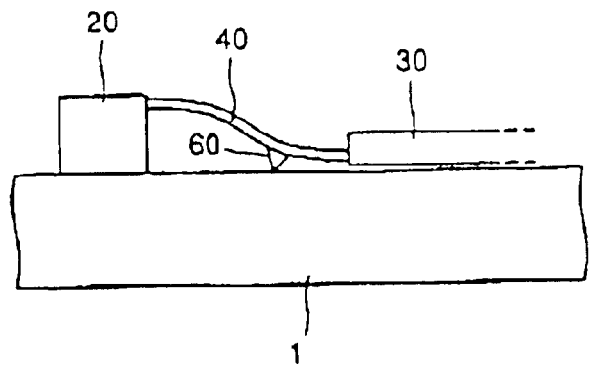
FIG. 7 shows a flexure transformed by external force (electrostatic force) applied to a moveable element in the MEMS device shown in FIG. 6.

In the present invention, as shown in FIG. 6, a stopper 60 as a repulsive element for making the repulsive force of a flexure element 40 non-linear is positioned on the bottom surface of the flexure element 40. The stopper 60 contacts the surface of the substrate 10 ahead of the moveable element 30 as shown in FIG. 7 when the moveable element 30 approaches the substrate 10 due to electrostatic attractive force. The repulsive force of the flexure element 30 becomes non-linear due to a sharp increase in the flexure constant of the flexure element 30 if the stopper 60 contacts the substrate 10.

Figure 8:
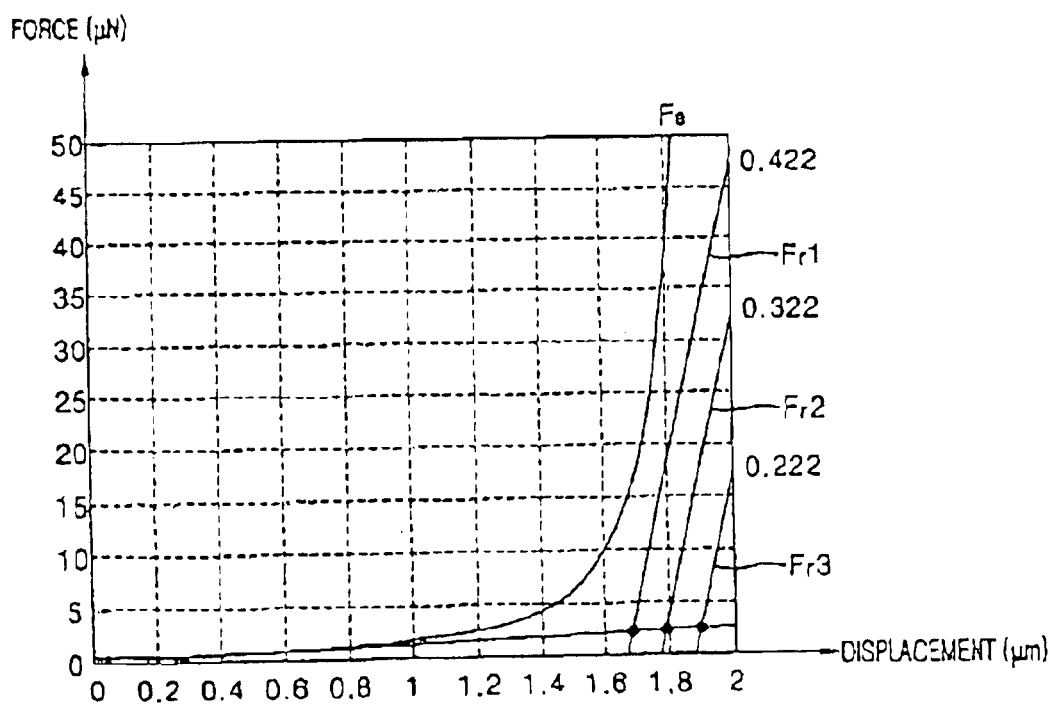
FIG. 8 is a graph showing electrostatic force $F_s$ and flexure repulsive forces $F_r1$, $F_r2$, and $F_r3$ versus displacement of the moveable element in a MEMS device according to the present invention.

FIG. 8 is a graph showing electrostatic force $F_s$ and flexure repulsive forces $F_r1$, $F_r2$, and $F_r3$ versus displacement of the moveable element 30 in the MEMS device shown in FIGS. 6 and 7. Referring to FIG. 8, electrostatic attractive force $F_s$ sharply increases as shown in FIG. 5. However, flexure repulsive forces $F_r1$, $F_r2$, and $F_r3$ steeply increase after the stopper 60 contacts the substrate 10. Flexure repulsive forces $F_r1$, $F_r2$, and $F_r3$ gently increase in a straight line before the stopper 60 contacts the substrate 10 while flexure repulsive forces $F_r1$, $F_r2$, and $F_r3$ sharply increase to maintain values lower but little different than the electrostatic attractive force $F_s$ after the stopper 60 contacts the substrate 10. In FIG. 8, $F_r1$ denotes flexure repulsive force when the height of the stopper 60 is 0.422 micrometers, $F_r2$ denotes flexure repulsive force when the height of the stopper 60 is 0.322 micrometers, and $F_r3$ denotes flexure repulsive force when the height of the stopper 60 is 0.222 micrometers. Here, there is a common condition that the distance "a" from a support element 20 to the stopper 60 is 0.85 times the entire length "L" of the flexure element 40.

Figure 9:
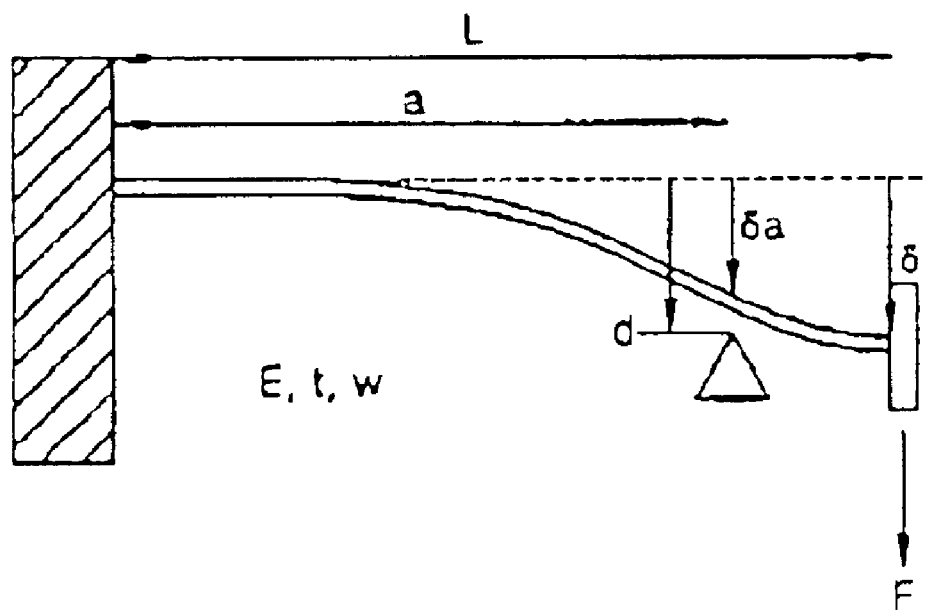
FIG. 9 is a drawing for explaining the concept of the present invention.

Referring to FIG. 9, when the entire length of a flexure element 40 is "L", the distance from the support element 20 to the stopper 60 is "a", the distance from the stopper 60 (which appears separated from the flexure element 40 in FIG. 9 for explanation purposes) to the substrate 10 is "d", the displacement at a portion in which the stopper 60 is positioned is "δa", the maximum displacement of the flexure element 40 is "δ", and force (electrostatic attractive force) is "F", the following Formulas 1 and 2 can be described:

$$F = \frac{12EI}{L^3} \cdot \delta \tag{1}$$

where "δa" is greater than 0 and smaller than "d".

$$F = \frac{3EI(4L-3a)}{L(L-a)^3}\left[\delta - \frac{(3L-2a)L}{(4L-3a)a}d\right] \tag{2}$$

where "δa" is greater than "d".

In formulas 1 and 2, "E" is Young's modulus and "I" is the moment of inertia. Formula 1 represents force when the stopper 60 does not contact the substrate 10 and formula 2 represents force when the stopper 60 contacts the substrate 10. From formulas 1 and 2, it is noticed that flexure repulsive force very steeply increases after the stopper 60 contacts the substrate 10. Thus, the moveable element 30 is strongly attracted force to the substrate 10 by the strong electrostatic force while the flexure repulsive force is also strongly applied. As a result, the moveable element 30 can easily be separated from the substrate 10 without sticking.

The stopper 60 may be formed on the substrate 10 opposite to the flexure element 40 as well as on the flexure element 40. A position-fixed element is needed to provide non-linear repulsive force of the flexure element 40 if the moveable element 30 moves in a direction parallel to the plane of the substrate 10.

Figure 10:
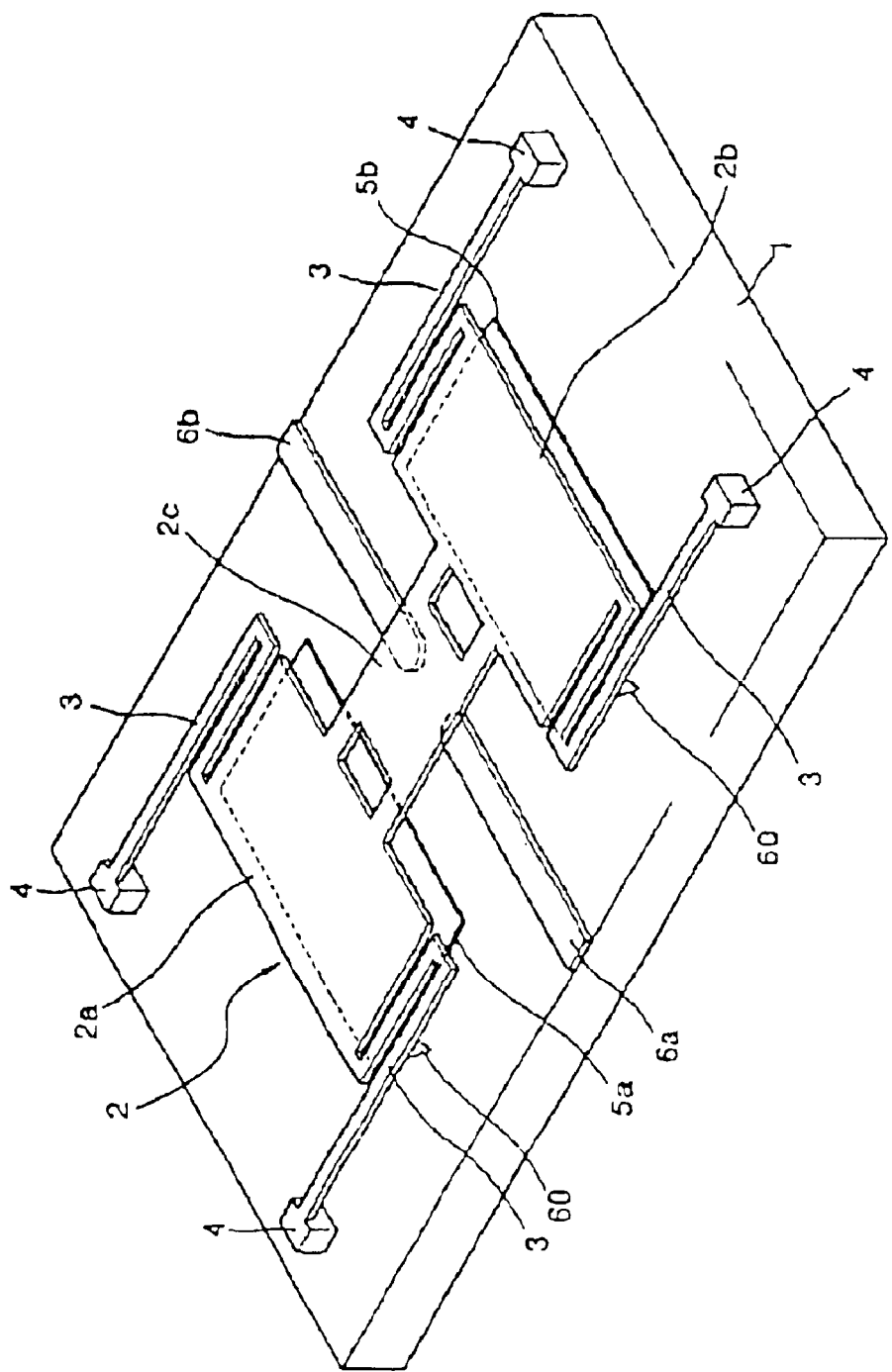
FIG. 10 is a perspective view of a micro switching device which is a MEMS device according to the present invention.

FIG. 10 is a perspective view of a MEMS device according to the present invention. The MEMS device shown in FIG. 10 has a structure in which the concept of the present invention is applied to a micro switching device. As shown in FIG. 10, stoppers 60 are formed almost at the centers of flexures 3. The stoppers 60 are formed on the bottom surfaces of the flexures 3, and lower ends of the stoppers 60 are far from a substrate 1 in a normal state. The other elements are the same as those shown in FIGS. 1 and 2, and thus are not explained.

Alternatively, the stoppers 60 may be formed on a static element opposite to the flexures 30 rather than on the bottom surfaces of the flexures 3. In FIG. 10, the static element corresponds to the surface of the substrate 1. Thus, the stoppers 60 may be formed on the substrate 1 below the flexures 3.

Figure 11A:
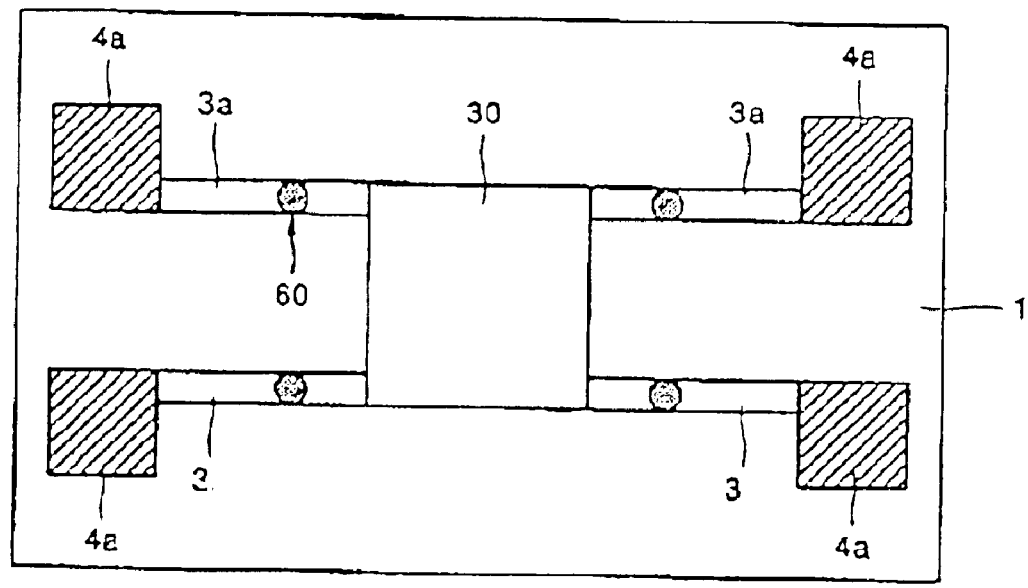
FIG. 11A is a schematic plan view of another embodiment of a MEMS device according to the present invention.
Figure 11B:
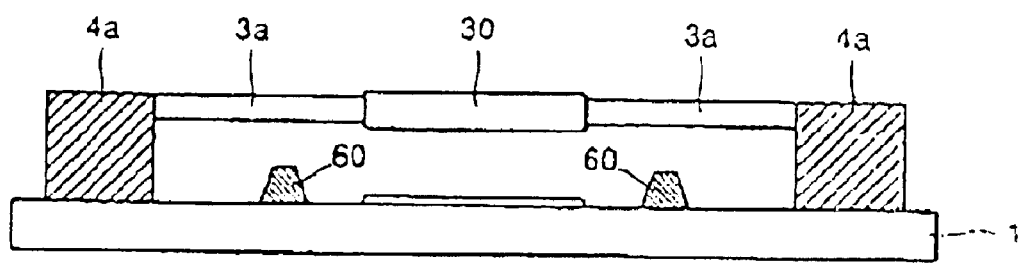
FIG. 11B is a schematic cross-section of the MEMS device shown in FIG. 11A.

FIGS. 11A and 11B are schematic views showing the stoppers 60 on the static element, i.e., a substrate 1. Referring to FIGS. 11A and 11B, posts, i.e., four support elements 4a, are formed on the substrate 1. A moveable element 30 is positioned in the center of the support elements 4a. The moveable element 30 is supported by four flexures 3a. The stoppers 60 are formed on the substrate 1 under the flexures 3a.

Figure 12:
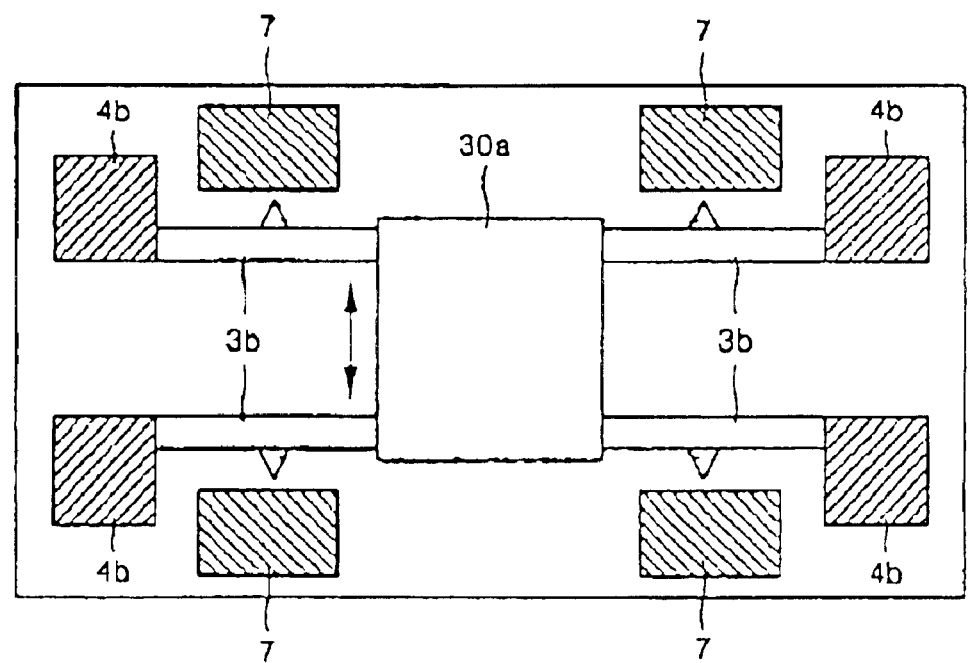
FIG. 12 is a schematic plan view of another embodiment of a MEMS device according to the present invention.

FIG. 12 is a schematic view showing a moveable element 30a which moves in a direction parallel to the plane of a substrate 1. Referring to FIG. 12, posts, i.e., four support elements 4b, are formed on the substrate 1. The moveable element 30a is positioned in the center of the support elements 4b. The moveable element 30a is supported by four flexures 3b and moves in a direction parallel to the plane of the substrate 1. Static elements 7, which are fixed structures, are formed to a predetermined height in the movement direction of the moveable element 30a, facing the flexures 3b. Stoppers 60a are formed on sides of the flexures 3b opposite to the static elements 7.

As described above, a micro switching device according to embodiments of the present invention has flexures supporting micro structures and can be applied to any MEMS device requiring non-linear repulsive force.

In a MEMS device according to the present invention, the range of controlling the position of a moveable element may be extended if flexure elements having non-linear repulsive force control the position of the moveable element.

A great restoring force can be obtained by flexure elements having non-linear repulsive force and the moveable element can be prevented from sticking. A MEMS device according to the present invention has much higher reliability than a conventional MEMS device.

While this invention has been particularly shown and described with reference to preferred embodiments thereof it will be understood by those skilled in the art that various changes in form and details may be made therein without departing from the spirit and scope of the invention as defined by the appended claims.

What is claimed is:

1. A MEMS device having flexure elements with non-linear restoring force, comprising:
    a substrate;
    support elements formed on the substrate;
    a moveable element floated over the substrate by the support elements so as to move;
    flexure elements for elastically suspending the moveable element on the support elements;
    a driving element for moving the moveable element;
    repulsive elements for increasing the repulsive force of the flexure elements when the flexure elements supporting the moveable element are resiliently deformed by a predetermined amount during movement of the moveable element.

2. The MEMS device of claim 1, wherein the moveable element moves in a direction perpendicular to the plane of the substrate.

3. The MEMS device of claim 1, wherein the movable element moves in a direction parallel to the plane of the substrate.

4. The MEMS device of claim 1, wherein the repulsive elements include stoppers having a predetermined size and positioned between the flexure elements and static elements, the static elements being fixed on the substrate opposite to the flexure elements.

5. The MEMS device of claim 2, wherein the movable element moves in a direction parallel to the plane of the substrate.

6. The MEMS device of claim 4, wherein the moveable element moves in a direction perpendicular to the plane of the substrate.

7. The MEMS device of claim 4, wherein the stoppers are formed on middle portions of the flexure elements opposite to the static elements so that the stoppers contact the static elements when the flexure elements are resiliently deformed by a predetermined amount.

8. The MEMS device of claim 4, wherein the movable element moves in a direction parallel to the plane of the substrate.

9. The MEMS device of claim 7, wherein the moveable element moves in a direction perpendicular to the plane of the substrate.

10. The MEMS device of claim 4, wherein the stoppers are positioned at portions of the static elements opposite to the flexure elements so that middle portions of the flexure elements contact the stoppers when the flexure elements are resiliently deformed by a predetermined amount.

11. The MEMS device of claim 10, wherein the moveable element moves in a direction perpendicular to the plane of the substrate.

12. The MEMS device of claim 3, wherein the movable element moves in a direction parallel to the plane of the substrate.

13. A MEMS device having flexure elements with non-linear restoring force, comprising:
    a substrate;
    support elements located on the substrate;
    a moveable element suspended over the substrate by the support elements so as to be moveable;
    flexure elements for elastically suspending the moveable element on the support elements;
    repulsive elements for increasing the repulsive force of the flexure elements when the flexure elements supporting the moveable element are resiliently deformed by a predetermined amount in a direction, while permitting the moveable element to further move in said direction subject to said increased repulsive force.

14. The MEMS device of claim 13, wherein the moveable element moves in a direction perpendicular to the plane of the substrate.

15. The MEMS device of claim 13, wherein the movable element moves in a direction parallel to the plane of the substrate.

16. The MEMS device of claim 13, wherein the repulsive elements include stoppers having a predetermined size and are positioned between the flexure elements and static elements, the static elements being fixed on the substrate opposite to the flexure elements.

17. The MEMS device of claim 16, wherein the stoppers are positioned at portions of the static elements opposite to the flexure elements so that the middle portions of the flexure elements contact the stoppers when the flexure elements are resiliently deformed by a predetermined amount.

18. The MEMS device of claim 16, wherein the stoppers are formed on middle portions of the flexure elements opposite to the static elements so that the stoppers contact the static elements when the flexure elements are resiliently deformed by a predetermined amount.

* * * * *